(12) United States Patent
Jung

(10) Patent No.: US 10,090,842 B2
(45) Date of Patent: Oct. 2, 2018

(54) FREQUENCY DIVIDER REGARDING VARIABLE DIVISION RATIO

(71) Applicant: SK hynix Inc., Icheon-si, Gyeonggi-do (KR)

(72) Inventor: In Hwa Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/385,308

(22) Filed: Dec. 20, 2016

(65) Prior Publication Data

US 2018/0019753 A1    Jan. 18, 2018

(30) Foreign Application Priority Data

Jul. 18, 2016    (KR) .................. 10-2016-0090926

(51) Int. Cl.
*H03K 21/10* (2006.01)
*H03K 19/20* (2006.01)

(52) U.S. Cl.
CPC ............ *H03K 21/10* (2013.01); *H03K 19/20* (2013.01)

(58) Field of Classification Search
CPC ............................... H03K 19/20; H03K 21/10
USPC .................................. 327/113, 115, 116, 117
See application file for complete search history.

(56) References Cited

U.S. PATENT DOCUMENTS 6,157,694 A * 12/2000 Larsson ................. H03K 23/68
327/115

FOREIGN PATENT DOCUMENTS

KR    1020090036446 A    4/2009
KR    1020170094036 A    8/2017

* cited by examiner

*Primary Examiner* — John Poos
(74) *Attorney, Agent, or Firm* — William Park & Associates Ltd.

(57) ABSTRACT

A frequency divider may be provided. The frequency divider may be configured to generate a division signal having a variable cycle according to transition timing information and a division ratio signal.

17 Claims, 9 Drawing Sheets

US 10,090,842 B2

FREQUENCY DIVIDER REGARDING VARIABLE DIVISION RATIO

CROSS-REFERENCES TO RELATED APPLICATION

The present application claims priority under 35 U.S.C. § 119(a) to Korean application number 10-2016-0090926, filed on Jul. 18, 2016, in the Korean Intellectual Property Office, which is incorporated herein by reference in its entirety.

BACKGROUND

1. Technical Field

Various embodiments may generally relate to a semiconductor circuit, and more particularly, to a frequency divider regarding a variable division ratio.

2. Related Art

A semiconductor circuit needs to divide an external input signal, for example, a clock signal according to an internal operation. Thus, the semiconductor circuit has a divider.

Since the duty ratio of the external input signal has an influence on an output signal of the divider or a division signal, there is a demand for a divider which can perform a reliable operation in response to various external input signals.

SUMMARY

In an embodiment of the present disclosure, a frequency divider may be provided. The frequency divider may be configured to generate a division signal having a variable cycle according to transition timing information and a division ratio signal.

DETAILED DESCRIPTION

Hereinafter, a frequency divider with a variable division ratio according to the present disclosure may be described below with reference to the accompanying drawings through various examples of embodiments.

Various embodiments may be directed to a frequency divider capable of generating a division signal with a desired division ratio and duty ratio, regardless of an input signal.

Figure 1:
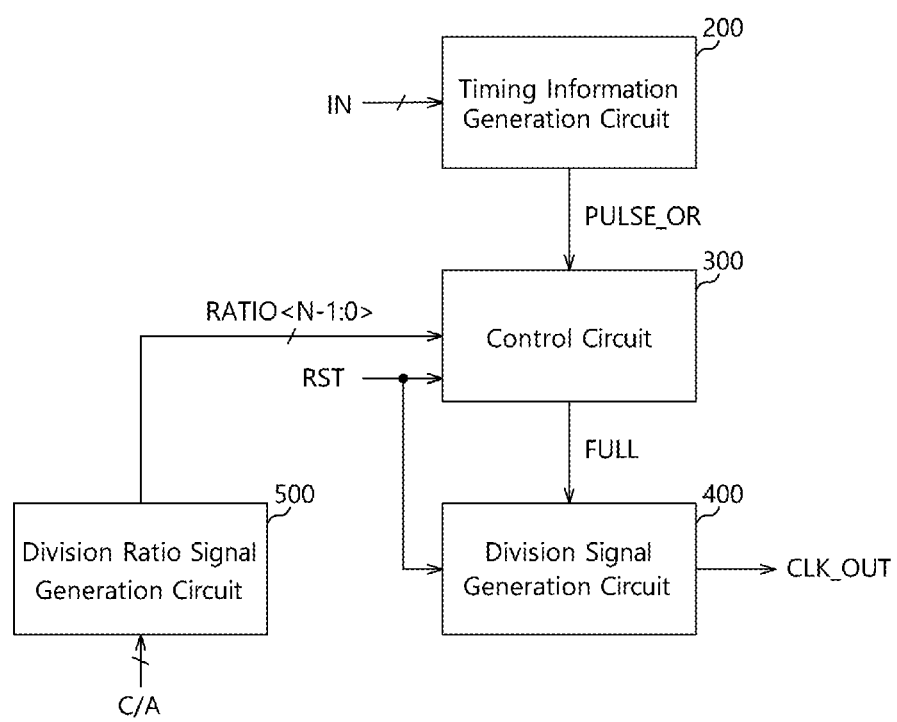
FIG. 1 is a diagram illustrating a representation of an example of the configuration of a frequency divider according to an embodiment.

Referring to FIG. 1, a frequency divider 100 according to an embodiment may include a timing information generation circuit 200, a control circuit 300, a division signal generation circuit 400 and a division ratio signal generation circuit 500.

The timing information generation circuit 200 may detect transition timing of an input signal IN, and generate a transition timing signal PULSE_OR.

Although described below, the input signal IN may include a clock signal. The timing information generation circuit 200 may be configured according to the phase (single/differential/multiple) of the clock signal.

The control circuit 300 may compare a count signal generated by counting the transition timing information or the transition timing signal PULSE_OR to a division ratio signal RATIO<N−1:0>, and generate an output control signal FULL.

The control circuit 300 may reset the output control signal FULL according to a reset signal RST.

The division signal generation circuit 400 may generate a division signal CLK_OUT having a cycle corresponding to the output control signal FULL.

The division signal generation circuit 400 may reset the division signal CLK_OUT according to the reset signal RST.

The division ratio signal generation circuit 500 may generate the division ratio signal RATIO<N−1:0> according to an external control signal, for example, a command/address (C/A). In an embodiment, the division ratio signal generation circuit 500 receives an external control signal externally from the frequency divider.

Figure 2:
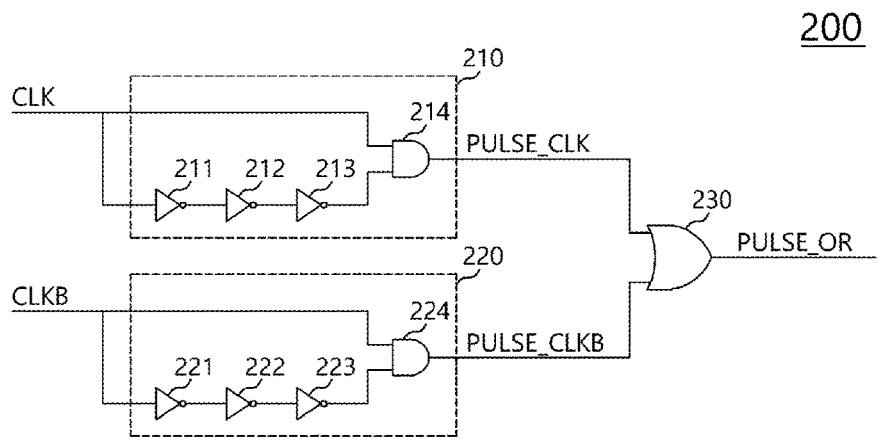
FIG. 2 is a diagram illustrating a representation of an example of the configuration of a timing information generation circuit of FIG. 1.

FIG. 2 illustrates an example in which the timing information generation circuit 200 receives an input signal IN corresponding to clock signals with differential phases, that is, first and second differential clock signals CLK/CKLB.

The timing information generation circuit 200 may include a first edge detection circuit 210, a second edge detection circuit 220 and a signal combination unit 230.

The first edge detection circuit 210 may generate a first pulse signal PULSE_CLK corresponding to rising edges of the first differential clock signal CLK.

The first edge detection circuit 210 may include first to fourth logic gates 211 to 214.

The first to third logic gates 211 to 213 may include delay units which are implemented with inverters, and delay the first differential clock signal CLK by a preset time.

The fourth logic gate 214 may perform an AND operation on the first differential clock signal CLK and an output signal of the third logic gate 211, and output the operation result as the first pulse signal PULSE_CLK.

The second edge detection circuit 220 may generate a second pulse signal PULSE_CLKB corresponding to rising edges of the second differential clock signal CLKB.

The second edge detection circuit 220 may include first to fourth logic gates 221 to 224.

The first to third logic gates 221 to 223 may include delay units which are implemented with inverters, and delay the second differential clock signal CLKB by a preset time.

The fourth logic gate 224 may perform an AND operation on the second different clock signal CLKB and an output signal of the third logic gate 223, and output the operation result as the second pulse signal PULSE_CLKB.

The signal combination unit 230 may perform an OR operation on the first pulse signal PULSE_CLK and the second pulse signal PULSE_CLKB, and output the operation result as the transition timing signal PULSE_OR.

Figure 3:
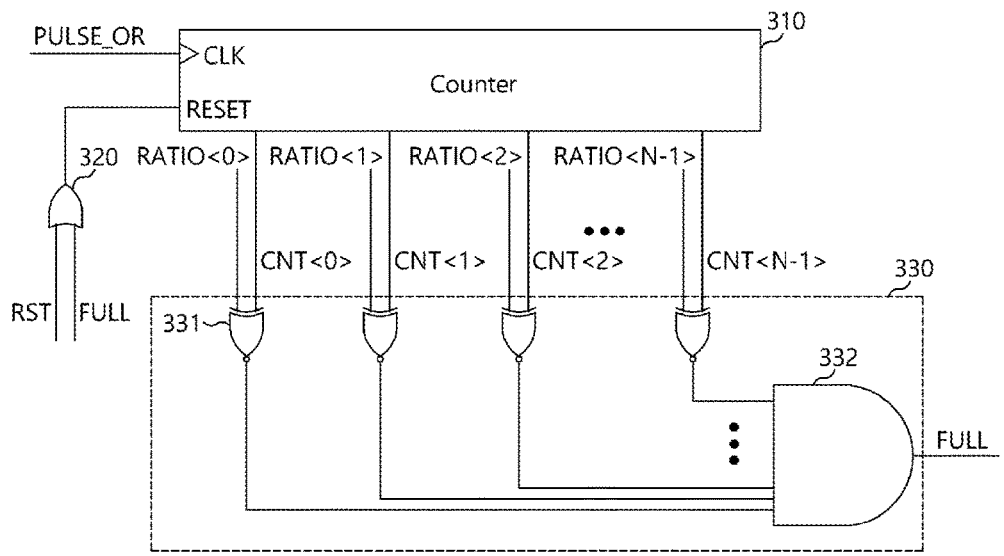
FIG. 3 is a diagram illustrating a representation of an example of the configuration of a control circuit of FIG. 1.

Referring to FIG. 3, the control circuit 300 may include a counter 310, an OR gate 320 and a comparator 330.

The counter 310 may generate a count signal CNT<N−1:0> by counting the transition timing signal PULSE_OR.

The OR gate 320 may reset the value of the count signal CNT<N−1:0> when any one of the reset signal RST and the output control signal FULL has an active level (for example, high level). Further, the logic levels of the signals may be different from or the opposite of those described. For example, a signal described as having a logic "high" level may alternatively have a logic "low" level, and a signal described as having a logic "low" level may alternatively have a logic "high" level.

The comparator 330 may compare the value of the count signal CNT<N−1:0> to the value of the division ratio signal RATIO<N−1:0>, and enable the output control signal FULL when the two values coincide with each other.

The comparator 330 may include a plurality of XNOR gates 331 and an AND gate 332.

The plurality of XNOR gates 331 may receive the respective bits of the count signal CNT<N−1:0> and the respective bits of the division ratio signal RATIO<N−1:0>.

The AND gate 332 may perform an AND operation on outputs of the plurality of XNOR gates 331, and output the operation result as the output control signal FULL.

Figure 4:
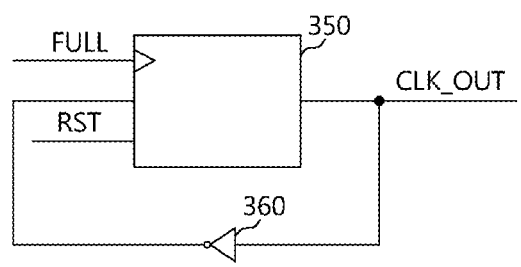
FIG. 4 is a diagram illustrating a representation of an example of the configuration of a division signal generation circuit of FIG. 1.

Referring to FIG. 4, the division signal generation circuit 400 may invert an output signal thereof or the division signal CLK_OUT whenever a pulse of the output control signal FULL is generated, thereby generating the division signal CLK_OUT having a constant duty ratio (for example but not limited to, 50:50).

The division signal generation circuit 400 may include a flip-flop 350 and an inverter 360.

The flip-flop 350 may output an inverted signal of the division signal CLK_OUT or an output of the inverter 360 according to a rising edge of the output control signal FULL.

The inverter 360 may invert the division signal CLK_OUT.

The flip-flop 350 may also receive a reset signal RST.

Figure 5:
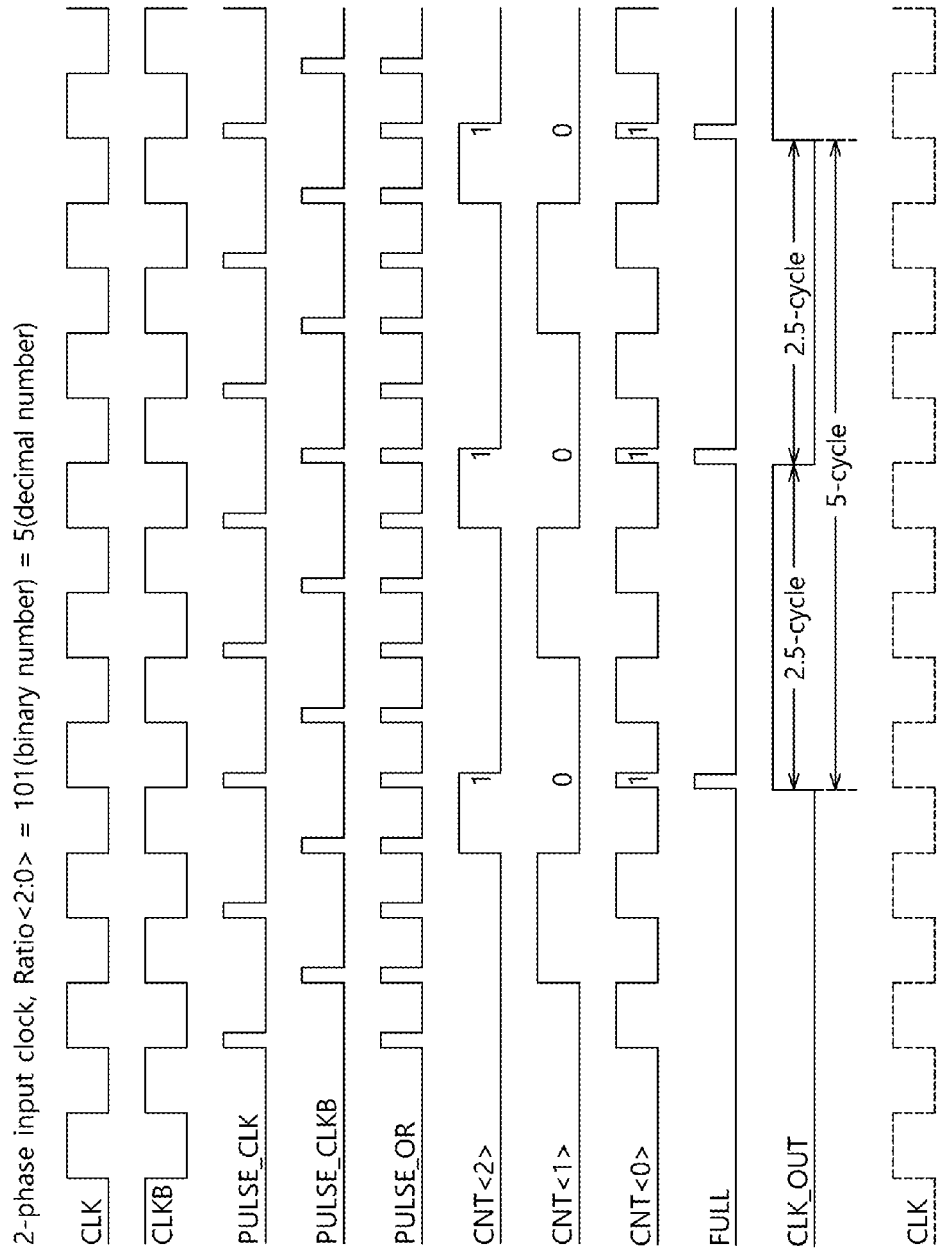
FIGS. 5 and 6 are operation timing diagrams of the divider according to a present embodiment under a condition in which, for example, an input signal has differential phases and a condition in which, for example, the input signal has a single phase.

Hereafter, the operation of the frequency divider 100 according to a present embodiment in a case where, for example, the input signal IN has differential phases will be described with reference to FIG. 5.

At this time, suppose, for example, that the division ratio signal RATIO<2:0> is set to a binary value of '101' or a decimal value of '5'.

Thus, the transition timing signal PULSE_OR having rising transition timing information of the first and second differential clock signals CLK and CLKB may be generated.

Since the value of the division ratio signal RATIO<2:0> is '101', the output control signal FULL may be generated in the form of a high-level pulse, whenever the value of the count signal CNT<2:0> is '101'.

Whenever the pulse of the output control signal FULL is generated, the value of the count signal CNT<2:0> may be reset to '000'.

When the phase number of the input signal IN is represented by 'M' and the decimal value of the division signal RATIO<2:0> is represented by 'K', the division ratio may be defined as 2*K/M. At this time, since M is 2 and K is 5, the division ratio may become 5.

Thus, as the division signal CLK_OUT transitions whenever a pulse of the output control signal FULL is generated, the division signal CLK_OUT having a cycle corresponding to five cycles of the clock signal CLK may be generated.

Furthermore, the output control signal FULL may be generated according to rising edges of the first and second differential clock signals CLK and CLKB.

Thus, when the duty ratio of the input signal IN or the first and second clock signals CLK and CLKB is not 50:50, the division signal CLK_OUT which is generated according to the output control signal FULL may have a constant duty ratio (for example, 50:50).

That is, the frequency divider 100 according to a present embodiment can not only vary the cycle of the input signal IN to a desired value, but also perform duty correction.

Figure 6:
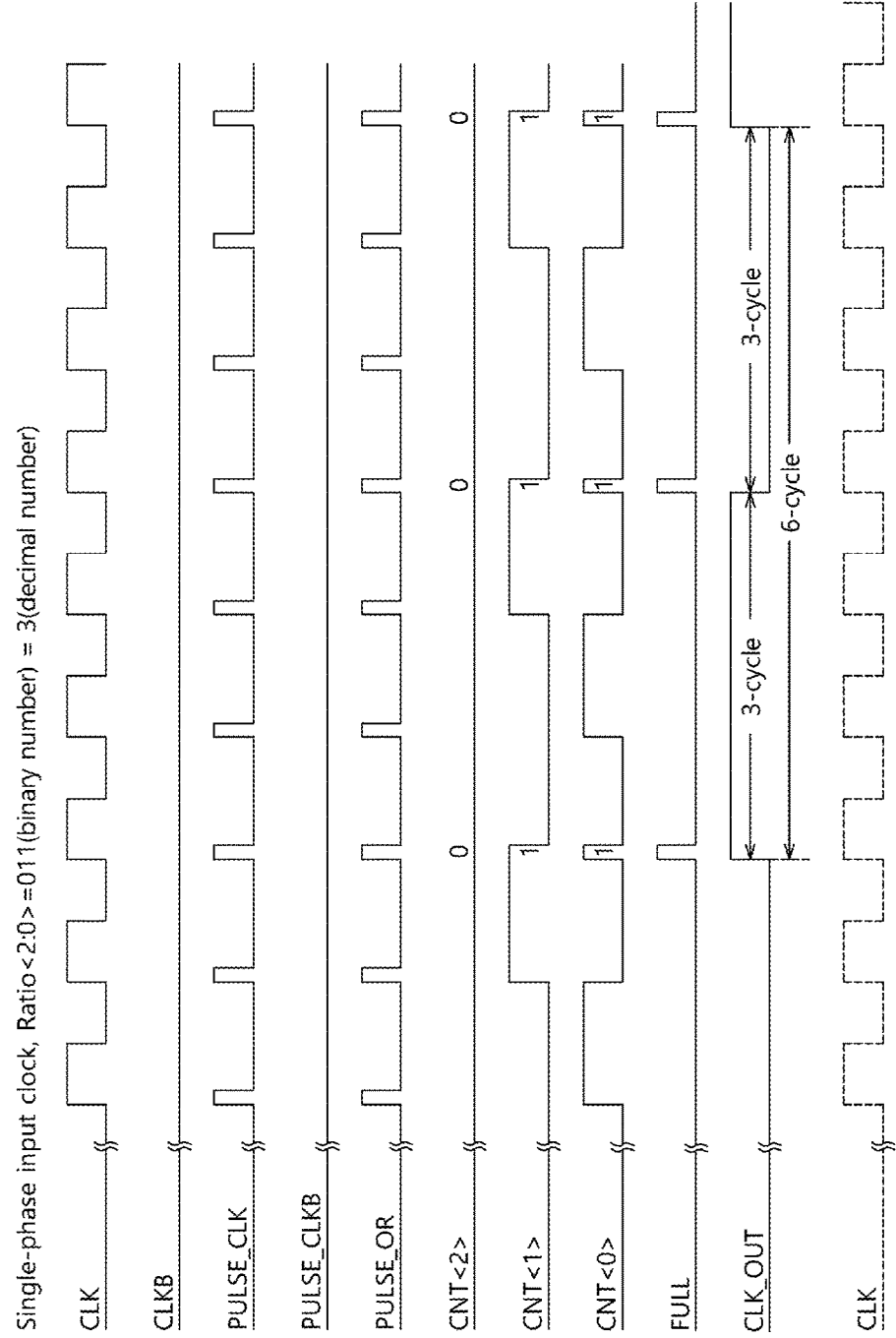

Hereafter, the operation of the frequency divider 100 according to a present embodiment in a case where, for example, the input signal IN has a single phase will be described with reference to FIG. 6.

In this case, suppose, for example, that the division ratio signal RATIO<2:0> is set to a binary value of '011' or a decimal value of '3'.

At this time, as only one of the first and second differential clock signals CLK and CLKB is controlled to be inputted or the second edge detection circuit 220 of FIG. 2 is controlled not to operate, the input signal IN may have a single phase.

Thus, the transition timing signal PULSE_OR having rising transition timing information of the first differential clock signal CLK may be generated.

Since the value of the division ratio signal RATIO<2:0> is '011', the output control signal FULL may be generated in the form of a high-level pulse, whenever the value of the count signal CNT<2:0> is '011'.

Whenever a pulse of the output control signal FULL is generated, the value of the count signal CNT<2:0> may be reset to '000'.

When the phase number of the input signal IN is represented by 'M' and the decimal value of the division signal RATIO<2:0> is represented by 'K', the division ratio may be defined as 2*K/M. At this time, since M is 1 and K is 3, the division ratio may become 6.

As the division signal CLK_OUT transitions whenever a pulse of the output control signal FULL is generated, the division signal CLK_OUT having a cycle corresponding to six cycles of the clock signal CLK may be generated.

Furthermore, as described with reference to FIG. 5, the division signal CLK_OUT may have a constant duty ratio (for example, 50:50).

Figure 7:
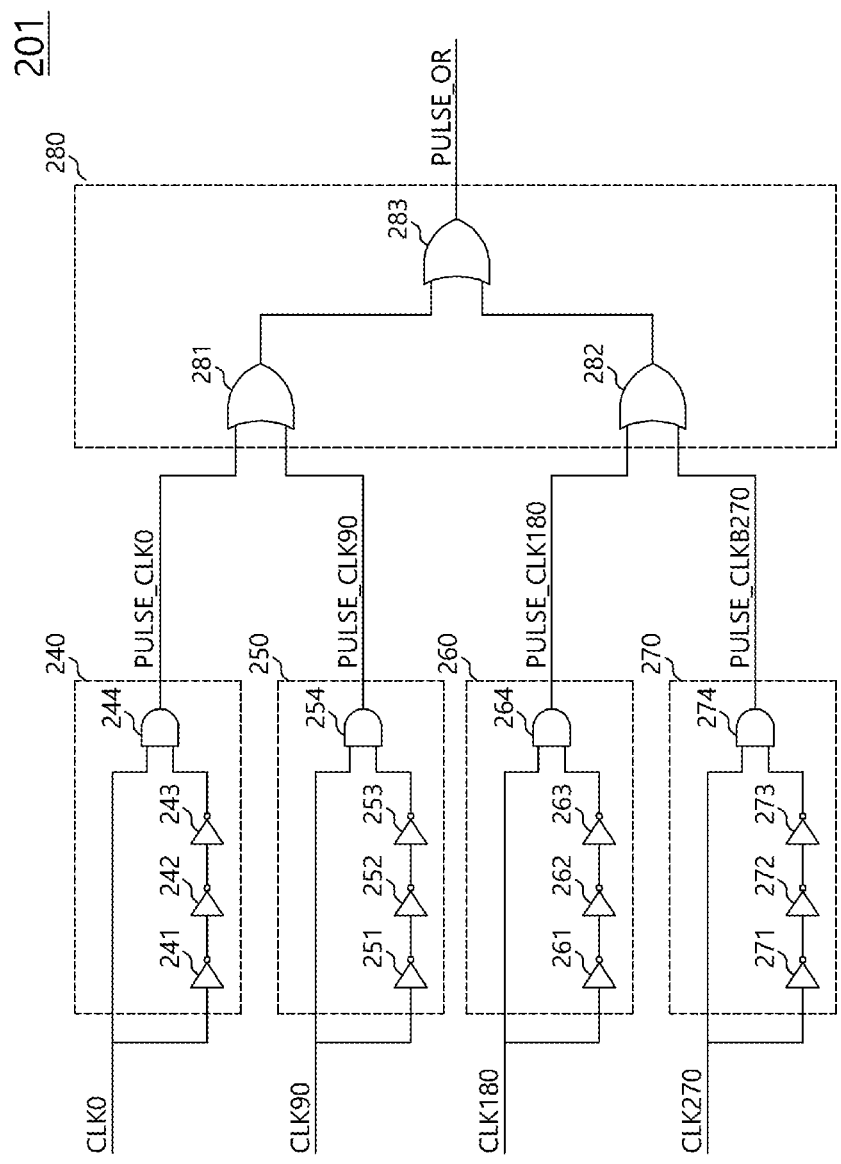
FIG. 7 is a diagram illustrating a representation of an example of the configuration of a pulse generation circuit according to a present embodiment for a multi-phase input.

When the input signal IN is a multi-phase signal, for example, 4-phase signal or includes first to fourth phase clock signals CLK0, CLK90, CLK180 and CLK270, the timing information generation circuit 201 may be configured as illustrated in FIG. 7.

For example, CLK0, CLK90, CLK180 and CLK270 may represent first to fourth phase clock signals, for convenience of description. Each of the first to fourth phase clock signals CLK0, CLK90, CLK180 and CLK270 may have a phase difference of 90 degrees, based on the first phase clock signal CLK0.

The timing information generation circuit 201 may include first to fourth edge detection circuits 240 to 270 and a signal combination unit 280.

The first edge detection circuit 240 may generate a first pulse signal PULSE_CLK0 corresponding to rising edges of the first phase clock signal CLK0.

The first edge detection circuit 240 may include first to fourth logic gates 241 to 244.

The second edge detection circuit 250 may generate a second pulse signal PULSE_CLK90 corresponding to rising edges of the second phase clock signal CLK90.

The second edge detection circuit 250 may include first to fourth logic gates 251 to 254.

The third edge detection circuit 260 may generate a third pulse signal PULSE_CLK180 corresponding to rising edges of the third phase clock signal CLK180.

The third edge detection circuit 260 may include first to fourth logic gates 261 to 264.

The fourth edge detection circuit 270 may generate a fourth pulse signal PULSE_CLK270 corresponding to rising edges of the fourth phase clock signal CLK270.

The fourth edge detection circuit 270 may include first to fourth logic gates 271 to 274.

Since the first to fourth edge detection circuits 240 to 270 can be configured in the same manner as the first edge detection circuit 210 of FIG. 2, the configurations thereof are omitted herein.

The signal combination unit 280 may perform an OR operation on the first to fourth pulse signals PULSE_CLK0 to PULSE_CLK270, and output the operation result as the transition timing signal PULSE_OR.

The signal combination unit 280 may include first to third logic gates 281 to 283.

The first OR gate 281 may perform an OR operation on the first pulse signal PULSE_CLK0 and the second pulse signal PULSE_CLK90.

The second OR gate 282 may perform an OR operation on the third pulse signal PULSE_CLK180 and the fourth pulse signal PULSE_CLK270.

The third OR gate 283 may perform an OR operation on an output signal of the first OR gate 281 and an output signal of the second OR gate 282, and output the operation result as the transition timing signal PULSE_OR.

Figure 8:
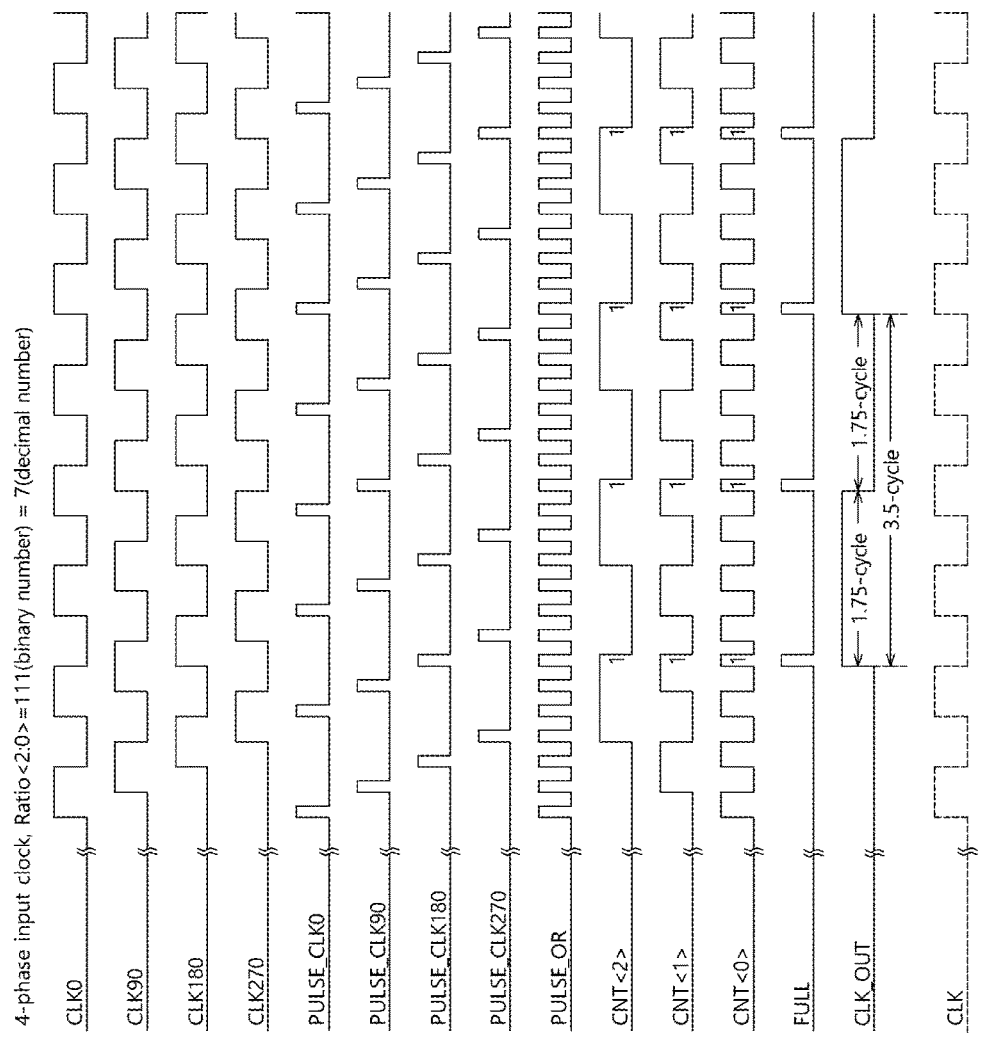
FIGS. 8 and 9 are operation timing diagrams of the divider according to a present embodiment under a condition in which, for example, an input signal is a multi-phase signal and under a condition in which, for example, a division ration signal has a different value.

Hereafter, the operation of the frequency divider 100 according to a present embodiment in case where the input signal IN is a multi-phase signal, for example, a 4-phase (CLK0, CLK90, CLK180 and CLK270) signal will be described with reference to FIG. 8.

For example, suppose that the division ratio signal RATIO<2:0> is set to a binary value of '111' or a decimal value of '7'.

Thus, the transition timing signal PULSE_OR having rising transition timing information of the first to fourth phase clock signals CLK0 to CLK270 may be generated.

Since the value of the division ratio signal RATIO<2:0> is '111', the output control signal FULL may be generated in the form of a high-level pulse, whenever the value of the count signal CNT<2:0> is '111'.

Whenever a pulse of the output control signal FULL is generated, the value of the count signal CNT<2:0> may be reset to '000'.

When the phase number of the input signal IN is represented by 'M' and the decimal value of the division signal RATIO<2:0> is represented by 'K', the division ratio may be defined as 2*K/M. At this time, since M is 4 and K is 7, the division ratio may become 3.5.

Thus, as the division signal CLK_OUT transitions whenever a pulse of the output control signal FULL is generated, the division signal CLK_OUT having a cycle corresponding to 3.5 cycles of the clock signal CLK may be generated.

Furthermore, since the output control signal FULL is generated based on the rising edges of the first to fourth phase clock signals CLK0 to CLK270, the division signal CLK_OUT generated according to the output control signal FULL may have a constant duty ratio (for example, 50:50).

Figure 9:
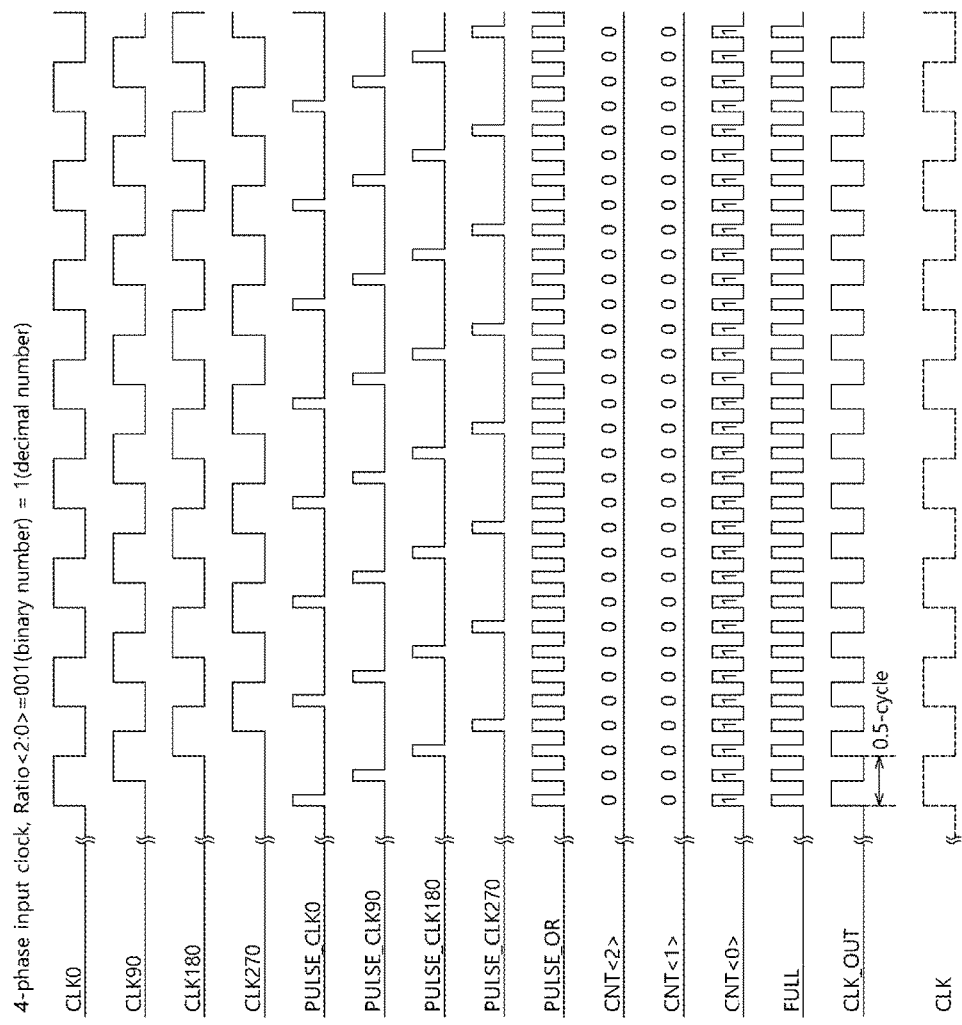

Next, the operation of the frequency divider 100 according to a present embodiment in a case where the input signal IN is a multi-phase signal, for example, a 4-phase (CLK0, CLK90, CLK180 and CLK270) signal as in FIG. 8 but the division ratio signal RATIO<2:0>, having a different value, will be described with reference to FIG. 9.

For example, suppose that the division ratio signal RATIO<2:0> is set to a binary value of '001' or a decimal value of '1'.

Thus, the transition timing signal PULSE_OR having rising transition timing information of the first to fourth phase clock signals CLK0 to CLK270 may be generated.

Since the value of the division ratio signal RATIO<2:0> is '001', the output control signal FULL may be generated in the form of a high-level pulse, whenever the value of the count signal CNT<2:0> is '001'.

Whenever a pulse of the output control signal FULL is generated, the value of the count signal CNT<2:0> may be reset to '000'.

The division ratio may be defined as 2*K/M. Since M is 4 and K is 1, the division ratio may become 0.5.

As the division signal CLK_OUT transitions whenever a pulse of the output control signal FULL is generated, the division signal CLK_OUT having a cycle corresponding to a half cycle of the clock signal CLK may be generated.

Furthermore, as described with reference to FIG. 8, the division signal CLK_OUT may have a constant duty ratio (for example, 50:50).

As described above, the frequency divider 100 according to the present embodiments may generate the division signal CLK_OUT having various cycles corresponding to a half cycle and multiples of the input signal IN according to the set division ratio. The frequency divider 100 may use the transition timing information of the input signal IN to perform a duty correction function of setting the division signal CLK_OUT to a constant duty ratio (for example but not limited to, 50:50).

Figure 10:
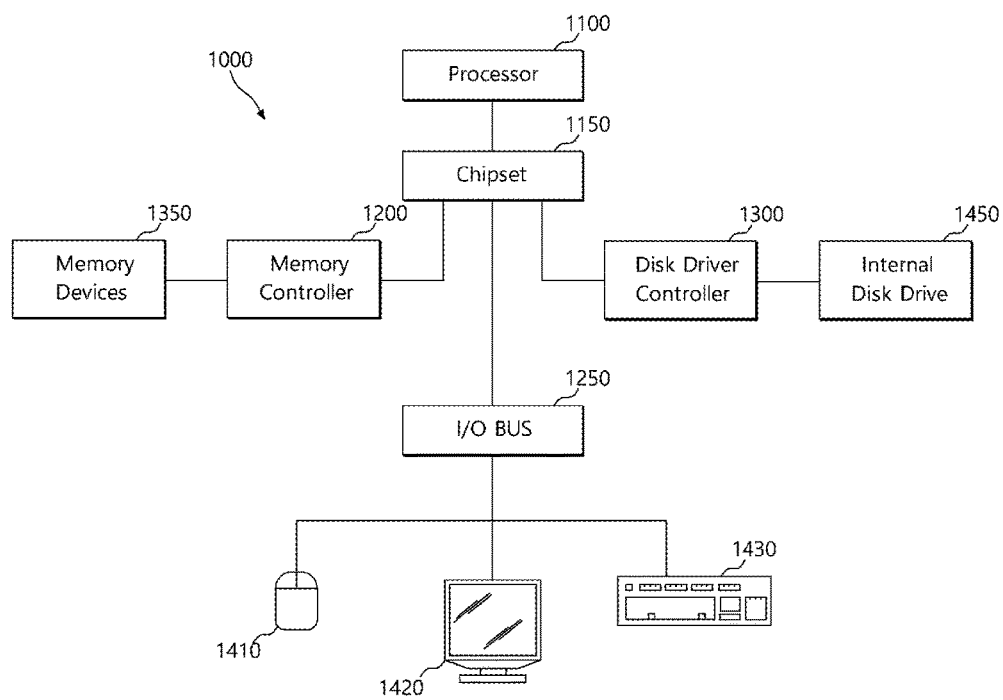
FIG. 10 illustrates a block diagram of an example of a representation of a system employing a frequency divider with the various embodiments discussed above with relation to FIGS. 1-9.

The frequency dividers as discussed above (see FIGS. 1-9) are particular useful in the design of other memory devices, processors, and computer systems. For example, referring to FIG. 10, a block diagram of a system employing a frequency divider in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one frequency divider as discussed above with reference to FIGS. 1-9. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one frequency divider as discussed above with relation to FIGS. 1-9, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 10 is merely one example of a frequency divider as discussed above with relation to FIGS. 1-9. In alternate embodiments, such as, for example but not limited to, cellular phones or digital cameras, the components may differ from the embodiments illustrated in FIG. 10.

While certain embodiments have been described above, it will be understood to those skilled in the art that the embodiments described are by way of example only. Accordingly, the semiconductor circuit described herein should not be limited based on the described embodiments. Rather, the semiconductor circuit described herein should only be limited in light of the claims that follow when taken in conjunction with the above description and accompanying drawings.

What is claimed is:

1. A frequency divider comprising:
    a timing information generation circuit configured to generate transition timing information of an input signal;
    a control circuit configured to generate an output control signal according to the transition timing information and a division ratio signal; and
    a division signal generation circuit configured to generate a division signal having a variable cycle according to the output control signal,
    wherein the division signal generation circuit generates the division signal whenever a pulse of the output control signal is generated.

2. The frequency divider according to claim 1, wherein the timing information generation circuit provides a transition timing signal as the transition timing information to the control circuit, the transition timing signal being generated according to an edge of the input signal.

3. The frequency divider according to claim 1, wherein a clock signal having a single phase or a plurality of clock signals having different phases are inputted as the input signal.

4. The frequency divider according to claim 3, wherein the timing information generation circuit comprises:
    a first edge detection circuit configured to generate a pulse signal corresponding to rising edges of a first clock signal among the plurality of clock signals;
    a second edge detection circuit configured to generate a second pulse signal corresponding to rising edges of a second clock signal among the plurality of clock signals; and
    a signal combination unit configured to perform an OR operation on the first and second pulse signals and output the operation result as the transition timing information.

5. The frequency divider according to claim 1, wherein the control circuit comprises:
    a counter configured to generate the count signal by counting the transition timing information; and
    a comparator configured to generate the output control signal by comparing the count signal and the division ratio signal.

6. The frequency divider according to claim 5, wherein the comparator enables the output control signal based on the value of the count signal and the value of the division ratio signal coinciding with each other.

7. The frequency divider according to claim 5, further comprising a logic gate configured to reset the value of the count signal based on any one of a reset signal and the output control signal having an active level.

8. A frequency divider comprising:
    a timing information generation circuit configured to generate a transition timing signal according to an edge of an input signal;
    a division ratio signal generation circuit configured to generate a division ratio signal based on an external control signal;
    a control circuit configured to compare the division ratio signal to a count signal generated by counting the transition timing signal, and generate an output control signal; and
    a division signal generation circuit configured to generate a division signal having a variable cycle according to the output control signal,
    wherein the division signal generation circuit generates the division signal whenever a pulse of the output control signal is generated.

9. The frequency divider according to claim 8, wherein a clock signal having a single phase or a plurality of clock signals having different phases are inputted as the input signal.

10. The frequency divider according to claim 9, wherein the timing information generation circuit comprises:
   a first edge detection circuit configured to generate a pulse signal corresponding to rising edges of a first clock signal among the plurality of clock signals;
   a second edge detection circuit configured to generate a second pulse signal corresponding to rising edges of a second clock signal among the plurality of clock signals; and
   a signal combination unit configured to perform an OR operation on the first and second pulse signals and output the operation result as the transition timing signal.

11. The frequency divider according to claim 8, wherein the control circuit comprises:
   a counter configured to generate the count signal by counting the transition timing signal; and
   a comparator configured to enable the output control signal based on the value of the count signal and the value of the division ratio signal coinciding with each other.

12. The frequency divider according to claim 11, further comprising a logic gate configured to reset the value of the count signal based on any one of a reset signal and the output control signal having an active level.

13. A frequency divider comprising:
   a timing information generation circuit configured to generate a transition timing signal according to an edge of an input signal;
   a control circuit configured to compare a count signal generated by counting the transition timing signal to a division ratio signal, and generate an output control signal; and
   a division signal generation circuit configured to generate a duty-corrected division signal having a variable cycle, based on the input signal, according to the output control signal,
   wherein the division signal generation circuit generates the division signal whenever a pulse of the output control signal is generated.

14. The frequency divider according to claim 13, wherein a clock signal having a signal phase or a plurality of clock signals having different phases are inputted as the input signal.

15. The frequency divider according to claim 14, wherein the timing information generation circuit configured to generate the transition timing signal according to an edge of the input signal comprises:
   a first edge detection circuit configured to generate a pulse signal corresponding to rising edges of a first clock signal among the plurality of clock signals;
   a second edge detection circuit configured to generate a second pulse signal corresponding to rising edges of a second clock signal among the plurality of clock signals; and
   a signal combination unit configured to perform an OR operation on the first and second pulse signals and output the operation result as the transition timing signal.

16. The frequency divider according to claim 13, wherein the control circuit comprises:
   a counter configured to generate the count signal by counting the transition timing signal; and
   a comparator configured to enable the output control signal based on the value of the count signal and the value of the division ratio signal coinciding with each other.

17. The frequency divider according to claim 16, further comprising a logic gate configured to reset the value of the count signal based on any one of a reset signal and the output control signal having an active level.

* * * * *